(12) United States Patent
Mings et al.

(10) Patent No.: US 9,437,640 B2
(45) Date of Patent: Sep. 6, 2016

(54) ENGINEERING INDUCED TUNABLE ELECTROSTATIC EFFECT

(71) Applicant: Applied Materials, Inc., Santa Clara, CA (US)

(72) Inventors: Sherry Mings, Milpitas, CA (US); Patricia M. Liu, Saratoga, CA (US); Steven C. H. Hung, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/481,038

(22) Filed: Sep. 9, 2014

(65) Prior Publication Data

US 2015/0069476 A1   Mar. 12, 2015

Related U.S. Application Data

(60) Provisional application No. 61/875,676, filed on Sep. 9, 2013.

(51) Int. Cl.
*H01L 27/14*    (2006.01)
*H01L 27/146*   (2006.01)

(52) U.S. Cl.
CPC ..... *H01L 27/14643* (2013.01); *H01L 27/1462* (2013.01); *H01L 27/1464* (2013.01); *H01L 27/14621* (2013.01); *H01L 27/14625* (2013.01); *H01L 27/14627* (2013.01); *H01L 27/14689* (2013.01)

(58) Field of Classification Search
CPC .............. H01L 27/14643; H01L 17/1462; H01L 27/14621; H01L 27/14627; H01L 27/14689
See application file for complete search history.

(56) References Cited

U.S. PATENT DOCUMENTS

| | | |
|---|---|---|
| 5,434,097 A | 7/1995 | Shin et al. |
| 5,631,702 A | 5/1997 | Miwada |
| 7,064,345 B2 | 6/2006 | Fix et al. |
| 7,619,266 B2 | 11/2009 | Mouli |
| 7,645,652 B2 | 1/2010 | Hyuk |
| 7,651,903 B2 | 1/2010 | Jeon |
| 7,687,306 B2 | 3/2010 | Jeon |
| 7,851,839 B2 | 12/2010 | Kim |
| 2009/0230488 A1 | 9/2009 | Ando |
| 2011/0025872 A1 | 2/2011 | Oshiyama et al. |
| 2011/0156104 A1* | 6/2011 | Yamaguchi ....... H01L 27/14603 257/222 |
| 2013/0200252 A1* | 8/2013 | Oshiyama ......... H01L 27/14632 250/208.1 |
| 2014/0061769 A1* | 3/2014 | Toratani ............ H01L 29/42332 257/324 |

OTHER PUBLICATIONS

PCT International Search Report and Written Opinion in PCT/US2014/054744, mailed Nov. 26, 2014, 11 pages.
PCT International Preliminary Report on Patentability in PCT/US2014/054744, mailed Mar. 24, 2016, 8 pages.

* cited by examiner

*Primary Examiner* — Roy Potter
*Assistant Examiner* — Paul Patton
(74) *Attorney, Agent, or Firm* — Servilla Whitney LLC

(57) ABSTRACT

Backside illuminated sensors and methods of manufacture are described. Specifically, a backside illuminated sensor with a dipole modulating layer near the photodiode is described.

20 Claims, 2 Drawing Sheets

ENGINEERING INDUCED TUNABLE ELECTROSTATIC EFFECT

CROSS-REFERENCE TO RELATED APPLICATIONS

This application claims the benefit of U.S. Provisional Application No. 61/875,676, filed Sep. 9, 2013.

BACKGROUND

Embodiments of the invention generally relate to devices and processes for forming the same. More specifically, embodiments of the invention are directed to backside illuminated image sensors with a tunable electrostatic effect and methods of forming the same.

In the formation of a backside illuminated (BSI) CMOS image sensors (CIS), a dielectric film is deposited above the photodiode. This dielectric film, frequently made of hafnium oxide, often has fixed negative charges to create a hole accumulation layer to suppress dark current caused by the interface between the photodiode and the dielectric layer. However, the electrostatic effect of the interface is not eliminated.

There is a need to control the electrostatic charge for many applications, including charges that result in dark current for optical applications. Typically, this is done by using hafnium oxide only films, and changing the thickness or implant conditions of the fixed negative charge inducing species.

However, there remains a need in the art for methods to provide control the electrostatic effect for a given film thickness.

SUMMARY

One or more embodiments of the invention are directed to methods of forming a device. A photodiode is formed on a surface adjacent to and in electrical communication with a gate electrode. An oxide layer is formed on the surface. An insulator having a thickness is deposited on the oxide layer. The insulator comprises a dipole modulating layer and a fixed charge layer.

Another embodiment of the invention is directed to a backside illuminated sensor comprising a substrate with a gate electrode thereon. A photodiode is adjacent to and in electrical communication with the gate electrode. An oxide layer is at a surface of the substrate. An insulator is above the oxide layer, the insulator comprising a dipole modulating layer and a fixed charge layer.

A further embodiment of the invention is directed to a backside illuminated sensor comprising a substrate with a gate electrode thereon. A photodiode is in electrical communication with the gate electrode. An oxide layer is at a surface of the substrate. An insulator having a thickness less than about 150 Å is above the oxide layer. The insulator comprises a dipole modulating layer and a fixed charge layer. The fixed charge layer comprises a first fixed charge sub-layer and a second fixed charge sub-layer and the dipole modulating layer is between the first fixed charge sub-layer and the second fixed charge sub-layer. An antireflective coating is over the insulating layer. A color filter and a lens are positioned over the antireflective coating to direct light toward the photodiode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally relate to new methods to reduce the dark current source of optical filters that are induced by the defects created by the grinding/polishing process. In one embodiment, the surface may or may not be treated by using decoupled plasma oxidation or thermally to create an oxide layer, followed by depositing a dipole layer, and then depositing a hafnium oxide layer. In another embodiment, the surface may or may not be treated by decoupled plasma oxidation or thermally to create an oxide layer, followed by a hafnium oxide layer, followed by a dipole layer, and topped with a hafnium oxide layer. In another embodiment, the surface may or may not be treated by decoupled plasma oxidation or thermally to create an oxide layer, followed by a hafnium oxide layer, followed by a dipole layer.

As used in this specification and the appended claims, the term "substrate", "substrate surface", "surface", "wafer", "wafer surface" and the like are used interchangeably, referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

It may be beneficial to control the electrostatic charge for many applications, including charges that result in dark current for optical applications. Typically, this is done by using hafnium oxide only films or silicon oxide-hafnium oxide films, and changing the thickness or implant conditions. Embodiments of the invention provide a method that can design or control the placement and amount of the electrostatic effect for a given film thickness, therefore enhancing the injection of photoelectrons into CIS photodiode array Embodiments of the invention add aluminum or titanium oxides, amongst other oxides, which are able to shift the flatband voltage and total charge. This, in turn, is able to reduce or eliminate the dark current for the optical sensor. The degree of that shift can be engineered into the film by modulating surface treatment and the placement and ratio in the film.

Figure 1:
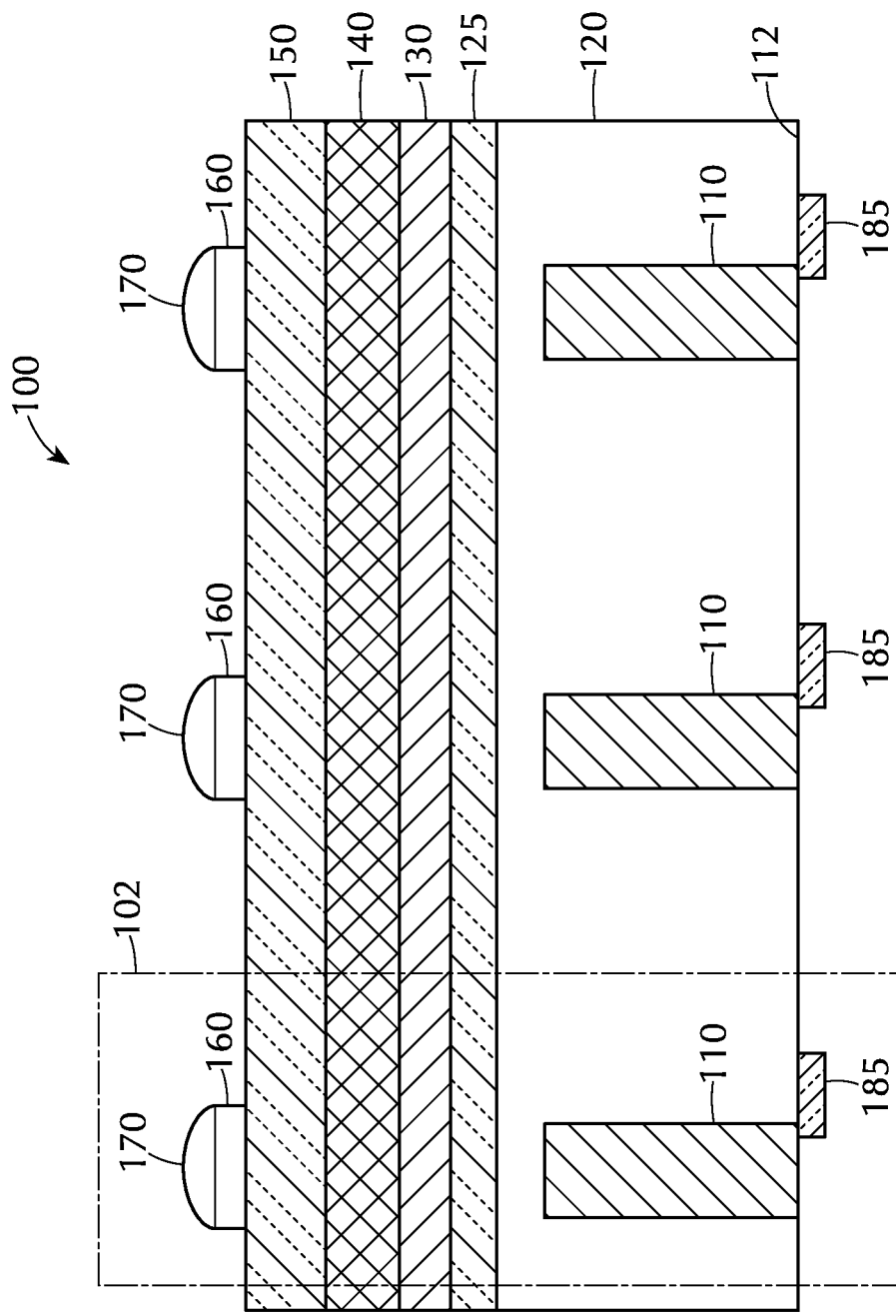
FIG. 1 shows a partial schematic cross-section of an optical device in accordance with one or more embodiments of the invention.
Figure 2:
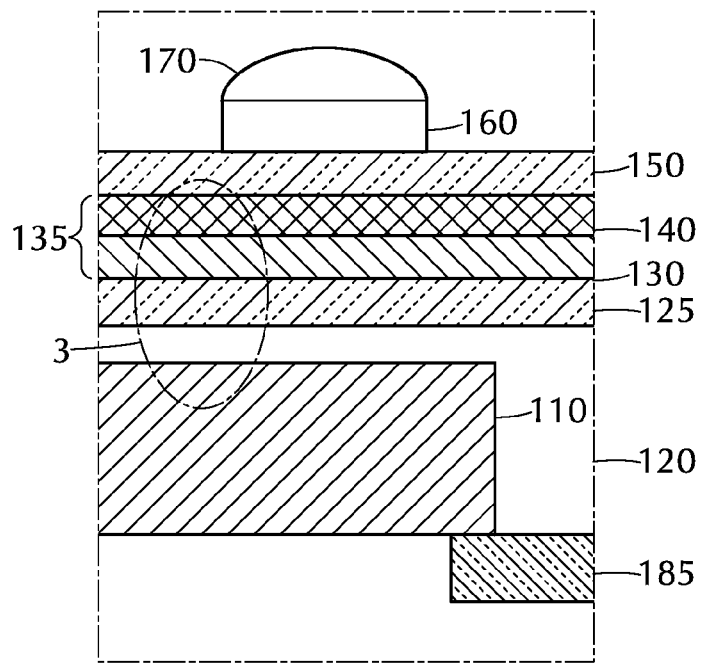
FIG. 2 shows a partial schematic cross-section of an optical device in accordance with one or more embodiments of the invention.

FIGS. 1 and 2 show a partial cross-sectional view of a device 100 in accordance with one or more embodiments of the invention. The device 100 shows a portion of a single pixel 102 of an optical device. The device 100 includes a photodiode 110 formed in a silicon insulating layer 120 and on a surface 112. The photodiode can be any suitable photodiode. There is typically a thickness of ~3 micron that separates the photodiode from the fixed charge area.

The fixed charge layer 140 can be made of any suitable dielectric material. For example high-k dielectrics (those with dielectric constants greater than silicon dioxide) can be used including, but not limited to, hafnium oxide.

The dipole modulating layer 130 can be any suitable compound including, but not limited to, a silicon dioxide surface treatment layer and titanium oxides, aluminum oxides, lanthanum oxides, zirconium oxides, tantalum oxides, cerium oxide, and yttrium oxides. Without being bound by any particular theory of operation, it is believed that the dipole modulating compound induces an increased negative charge that cancels the positive charge due to the surface defects created by the polishing process on the silicon surface to expose the photodiode 110, reducing the dark current for the optical sensor. In one or more embodiments, the dipole modulating layer 130 comprises titanium oxide.

The device 100 shown in FIGS. 1 and 2 further comprises an optional antireflective coating 150 on the insulating layer 120. The antireflective coating 150 can be any suitable material known to those skilled in the art that can provide higher transmission/lower reflection.

A color filter 160 is positioned over the fixed charge layer 140. If an antireflective coating 150 is present, then the color filter 160 may be positioned over the antireflective coating 150. The purpose of the color filter 160 is to filter wavelengths of light that are not being evaluated by the individual pixel 102. For example, if the pixel 102 is a green pixel, the majority of extraneous light may be filtered out by the color filter 160 so that any resulting electrical signal generated by the photodiode 110 is the product of the particular wavelengths of light.

A lens 170 is positioned over the color filter 160. The lens 170 collimates or focuses incoming light onto the photodiode 110.

The photodiode 110 is positioned on pixel circuitry 180. The pixel circuitry 180 can comprise a plurality of interconnects (not shown), insulators (not shown) and gate electrodes 185, as will be understood by those skilled in the art. In some embodiments, a gate electrode 185 is formed adjacent to and in electrical communication with the photodiode 110.

Figure 3:
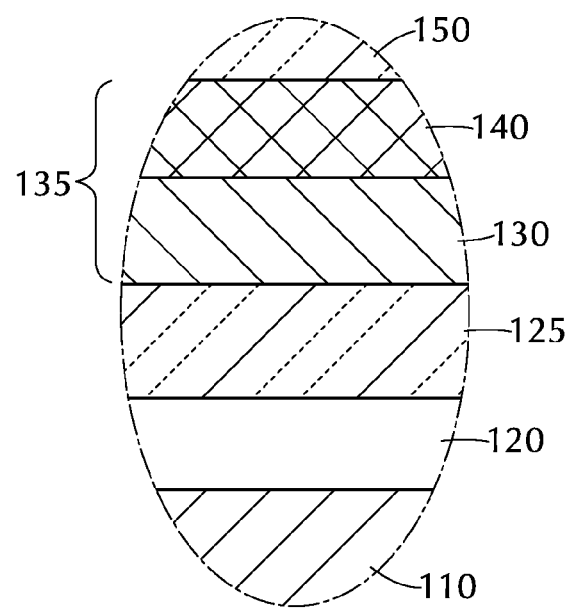
FIG. 3 shows a partial schematic cross-section of an optical device in accordance with one or more embodiments of the invention.

The position and thickness of the dipole modulating layer 130 can have an impact on the charge. In some embodiments, an oxide layer 125, for example, a silicon oxide layer for a silicon substrate is added. The oxide layer 125 can be formed by any suitable method including, but not limited to, chemically deposited oxide, thermal oxidation, or decoupled plasma oxidation. This oxide layer may be, for example a surface treatment on the substrate. The thickness of the oxide layer 125 can vary and is typically up to about 30 Å thick, but can be thicker or thinner. As shown in FIGS. 1 through 3, the dipole modulating layer 130 is positioned immediately under the fixed charge layer 140 and is in contact with the oxide layer 125 on one side and the fixed charge layer 140 on the other side. This configuration may be referred to as a bottom placement of the dipole modulating layer 130 as viewed with the lens 170 on top. As used in this specification and the appended claims, the terms "bottom", "middle" and "top" used in this context refer to the orientation of layers when the lens 170 side is position at the top, as shown in FIG. 2.

Figure 4:
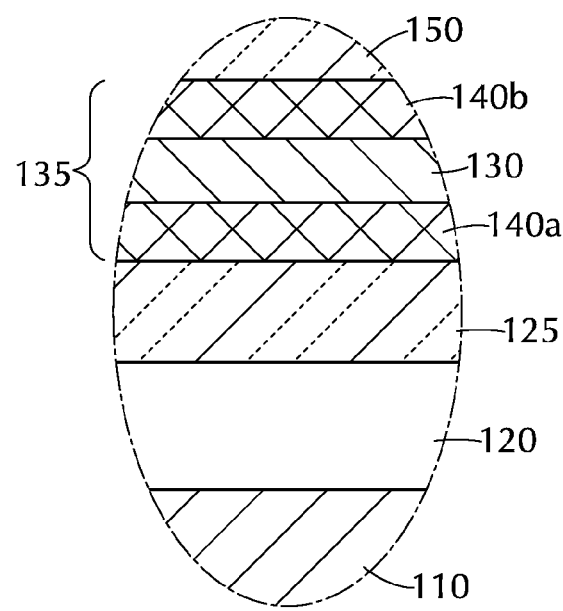
FIG. 4 shows a partial schematic cross-section of an optical device in accordance with one or more embodiments of the invention.

In some embodiments, the fixed charge layer 140 is formed between and contacts both the photodiode 110 and the dipole modulating layer 130. The dipole modulating layer 130 of the embodiment can contact the antireflective coating 150 on the other side. This is the reverse of the configuration shown in FIG. 3. Stated differently, in some embodiments, the fixed charge layer 140 is formed between and contacts both the oxide layer and the dipole modulating layer FIG. 4 shows another embodiment in which the insulator 125 comprises two dielectric sub-layers (i.e., two fixed charge sub-layers), a first fixed charge sub-layer 140a and a second fixed charge sub-layer 140b. The first fixed charge sub-layer 140a is shown contacting the photodiode 110 and the dipole modulating layer 130 and the dipole modulating layer 130 is positioned between the first fixed charge sub-layer 140a and the second fixed charge sub-layer 140b. The thickness of the first fixed charge sub-layer 140a will directly affect the distance of the dipole modulating layer 130 from the photodiode 110. This difference may also impact the reduction in dark current.

The thickness T of the insulator 125 can be any suitable thickness. In some embodiments, the insulator 125 is less than about 150 Å thick measured from the top of the photodiode 110 to the top of the insulator 125 layer. The dipole modulating layer 130 can be formed with any suitable thickness. In some embodiments, the thickness of the dipole modulating layer is in the range of about 1 Å to about 100 Å, or in the range of about 2 Å to about 90 Å, or in the range of about 3 Å to about 80 Å, or in the range of about 4 Å to about 70 Å, or in the range of about 5 Å to about 60 Å, or in the range of about 10 Å to about 50 Å. In one or more embodiments, the thickness of the dipole modulating layer 130 is greater than about 1 Å, 2 Å, 3 Å, 4 Å, 5 Å, 6 Å, 7 Å, 8 Å, 9 Å, 10 Å, 15 Å, 20 Å, 25 Å, 30 Å, 35 Å, 40 Å, 45 Å or 50 Å.

The ratio of the dipole modulating layer 130 to the fixed charge layer 140 in the insulating layer 120 can also have an impact on the charge. In some embodiments, the dipole modulating layer 130 and the fixed charge layer 140 are present in a ratio in the range of about 1:100 to about 100:1, or in the range of about 1:10 to about 10:1, in the range of about 1:5 to about 5:1, or in the range of about 1:2 to about 2:1.

When the dipole modulating layer 130 is spaced from the photodiode, the thickness of the first fixed charge sub-layer 140a can impact the charge as this thickness affects the distance that the dipole modulating layer 130 is positioned from the photodiode 110. In some embodiments, the first fixed charge sub-layer 140a has a thickness in the range of about 1 Å to about 100 Å, or in the range of about 2 Å to about 90 Å, or in the range of about 3 Å to about 80 Å, or in the range of about 4 Å to about 70 Å, or in the range of about 5 Å to about 60 Å, or in the range of about 10 Å to about 50 Å. In one or more embodiments, the thickness of the first fixed charge sub-layer 140a is greater than about 1 Å, 2 Å, 3 Å, 4 Å, 5 Å, 6 Å, 7 Å, 8 Å, 9 Å, 10 Å, 15 Å, 20 Å, 25 Å, 30 Å, 35 Å, 40 Å, 45 Å or 50 Å. In one or more embodiments, the first fixed charge sub-layer 140a has a thickness in the range about 1% to about 90% of the total thickness T of the insulator 125, or in the range of about 2% to about 80% or in the range of about 3% to about 70%, or in the range of about 4% to about 60% or in the range of about 5% to about 50%.

In some embodiments, one or more of the dipole modulating layer 130 and the fixed charge layer 140 are deposited by atomic layer deposition (ALD). Atomic layer deposition may allow for precise control of the thickness of the individual layers as ALD processes are theoretically self-limiting.

EXAMPLES

Each example has similar insulator thickness of about 50 Å to about 100 Å. The position of the dipole modulating film was changed from the bottom (immediately adjacent the oxide layer), to the middle, to the top (without additional insulator above). The results are summarized in Table 1. The units for the numbers are total charge ($E^{10}[\#/cm^2]$). The baseline is the $HfO_x$ only.

TABLE 1

Tunability by Dopant Placement

| | Aluminum | | | Titanium | | |
|---|---|---|---|---|---|---|
| $HfO_x$ only | Bottom | Middle | Top | Bottom | Middle | Top |
| 31.18 | −1.35 | 33.08 | 32.70 | −776.29 | −226.15 | 9.06 |

While the foregoing is directed to embodiments of the present invention, other and further embodiments of the invention may be devised without departing from the basic scope thereof, and the scope thereof is determined by the claims that follow.

What is claimed is:

1. A method of forming a device, the method comprising:
    forming a photodiode on a surface adjacent to and in electrical communication with a gate electrode, the photodiode formed in an insulating layer on the surface;
    forming an oxide layer having a thickness on the insulating layer; and
    depositing an insulator having a thickness on the oxide layer, the insulator comprising a dipole modulating layer having a thickness greater than about 10 Å and a fixed charge layer.

2. The method of claim 1, wherein the dipole modulating layer is formed between and contacts both of the oxide layer and the fixed charge layer.

3. The method of claim 1, wherein the fixed charge layer is formed between and contacts both the oxide layer and the dipole modulating layer.

4. The method of claim 1, wherein the insulator comprises two fixed charge sub-layers, a first fixed charge sub-layer and a second fixed charge sub-layer.

5. The method of claim 4, wherein the first fixed charge sub-layer contacts the oxide layer and the dipole modulating layer is positioned between the two fixed charge sub-layers.

6. The method of claim 5, wherein the first fixed charge sub-layer has a thickness in the range of about 1 Å to about 100 Å.

7. The method of claim 5, wherein the first fixed charge sub-layer has a thickness in the range about 1% to about 90% of a total thickness of the insulator.

8. The method of claim 5, wherein the dipole modulating layer is spaced from the oxide layer by a distance in the range of about 1 Å to about 90 Å.

9. The method of claim 1, wherein the thickness of the insulator is less than about 150 Å.

10. The method of claim 1, wherein the dipole modulating layer and the fixed charge layer are present in a ratio in the range of about 1:100 to about 100:1.

11. The method of claim 1, wherein the dipole modulating layer has a thickness in the range of about 1 Å to about 90 Å.

12. The method of claim 1, further comprising forming an antireflective coating on the insulator.

13. The method of claim 12, further comprising positioning a color filter over the insulator.

14. The method of claim 13, further comprising positioning a lens over the color filter.

15. A backside illuminated sensor comprising:
    a substrate with a gate electrode thereon;
    a photodiode in an insulating layer, the photodiode in electrical communication with the gate electrode, the insulating layer having a top above a top of the photodiode;
    an oxide layer having a thickness up to about 30 Å on the insulating layer; and
    an insulator above the oxide layer, the insulator comprising a dipole modulating layer and a fixed charge layer.

16. The sensor of claim 15, wherein the fixed charge layer comprises a first fixed charge sub-layer and a second fixed charge sub-layer and the dipole modulating layer is between the first fixed charge sub-layer and the second fixed charge sub-layer.

17. The sensor of claim 15, further comprising an antireflective coating over the insulator.

18. The sensor of claim 17, further comprising a color filter and a lens positioned over the antireflective coating to direct light toward the photodiode.

19. The sensor of claim 15, wherein the insulator has a thickness less than about 150 Å.

20. A backside illuminated sensor comprising:
    a substrate with a gate electrode thereon;
    an insulating layer having a top on the gate electrode;
    a photodiode having a top formed in the insulating layer and in electrical communication with the gate electrode, the top of the insulating layer being above the top of the photodiode;
    an oxide layer at the insulating layer;
    an insulator having a thickness less than about 150 Å above the oxide layer, the insulator comprising a dipole modulating layer and a fixed charge layer, the fixed charge layer comprising a first fixed charge sub-layer and a second fixed charge sub-layer and the dipole modulating layer is between the first fixed charge sub-layer and the second fixed charge sub-layer; and
    an antireflective coating over the insulator; and
    a color filter and a lens positioned over the antireflective coating to direct light toward the photodiode.

* * * * *